US010047185B2

(12) United States Patent
Imada et al.

(10) Patent No.: US 10,047,185 B2
(45) Date of Patent: Aug. 14, 2018

(54) NOVOLAC-TYPE PHENOLIC HYDROXYL GROUP-CONTAINING RESIN, PRODUCTION METHOD THEREFOR, CURABLE COMPOSITION, COMPOSITION FOR RESIST, AND COLOR RESIST

(71) Applicant: DIC Corporation, Tokyo (JP)

(72) Inventors: Tomoyuki Imada, Ichihara (JP); Yusuke Sato, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 15/127,113

(22) PCT Filed: Feb. 26, 2015

(86) PCT No.: PCT/JP2015/055573
§ 371 (c)(1),
(2) Date: Sep. 19, 2016

(87) PCT Pub. No.: WO2015/141427
PCT Pub. Date: Sep. 24, 2015

(65) Prior Publication Data
US 2017/0121444 A1    May 4, 2017

(30) Foreign Application Priority Data
Mar. 20, 2014    (JP) ................................. 2014-058139

(51) Int. Cl.
*C08G 8/08*    (2006.01)
*C08G 81/02*    (2006.01)
*G03F 7/038*    (2006.01)

(52) U.S. Cl.
CPC ............ *C08G 8/08* (2013.01); *C08G 81/024* (2013.01); *G03F 7/038* (2013.01)

(58) Field of Classification Search
CPC .. G03F 7/038; C08G 8/08; C08G 8/24; C08G 8/20; C08G 8/12; C08G 8/04
USPC ................................................. 430/192, 197
See application file for complete search history.

(56) References Cited

U.S. PATENT DOCUMENTS

| | | | | |
|---|---|---|---|---|
| 4,681,923 A * | 7/1987 | Demmer | ................... | C08G 8/28 204/478 |
| 5,468,590 A * | 11/1995 | Hashimoto | ............... | C08G 8/24 430/165 |
| 5,478,871 A | 12/1995 | Takebe et al. | | |
| 2013/0338329 A1 | 12/2013 | Imada et al. | | |
| 2014/0023969 A1 | 1/2014 | Imada et al. | | |
| 2016/0017083 A1* | 1/2016 | Imada | ....................... | C08G 8/28 430/286.1 |

FOREIGN PATENT DOCUMENTS

| | | |
|---|---|---|
| CN | 103384850 A | 11/2013 |
| CN | 103415541 A | 11/2013 |
| JP | 05-097946 A | 4/1993 |
| JP | 06-172499 A | 6/1994 |
| JP | 2008-138128 A | 6/2008 |
| JP | 2010-159362 A | 7/2010 |
| JP | 2013-227495 A | 11/2013 |

OTHER PUBLICATIONS

English translation of JP, 06-172499, A (1994) from machine translation from AIPN Japan Patent Office National Center for Industrial Property Information and Training, generated Dec. 11, 2017, 5 pages.*
English translation of JP, 2010-159362, A (2010) from machine translation from AIPN Japan Patent Office National Center for Industrial Property Information and Training, generated Dec. 25, 2017, 6 pages.*
NN82034894 "Novolac Resins for Lithography," IBM Tecnhical Disclosure Bulletin Mar. 1, 1982 publication date p. 4894.*
International Search Report dated May 19, 2015, issued for PCT/JP2015/055573.

* cited by examiner

*Primary Examiner* — Cynthia Hamilton
(74) *Attorney, Agent, or Firm* — Locke Lord LLP

(57) ABSTRACT

A novolac-type phenolic hydroxyl group-containing resin with formula (1) as a structural site repeating unit, $R^1$ represents one of a hydrogen atom, an alkyl group, and an aryl group, and X represents a structural site (α) represented by formula (2), $R^2$ and $R^3$ each represent one of a hydrogen atom, an alkyl group, an aryl group, and an aralkyl group; n and m are each an integer of 1 to 3; when n or m is 2 or 3, a plurality of each of $R^2$ and $R^3$ present in a molecule may be the same or different; and Ar represents one of a phenyl group, a naphthyl group, an anthryl group, and a structural site in which one or a plurality of hydrogen atoms in an aromatic nucleus of any one of these groups is substituted by one of an alkyl group, an aryl group, and an aralkyl group).

10 Claims, 2 Drawing Sheets

NOVOLAC-TYPE PHENOLIC HYDROXYL GROUP-CONTAINING RESIN, PRODUCTION METHOD THEREFOR, CURABLE COMPOSITION, COMPOSITION FOR RESIST, AND COLOR RESIST

TECHNICAL FIELD

The present invention relates to a novolac-type phenolic hydroxyl group-containing resin having excellent heat resistance, transparency, and light transmittance, a production method therefor, a curable composition containing the novolac-type phenolic hydroxyl group-containing resin, a composition for a resist containing the novolac-type phenolic hydroxyl group-containing resin, and a color resist.

BACKGROUND ART

A negative resist using an acrylic polymerization-type photosensitive resin material such as (meth)acryloyl group-containing compound or the like is used for display members such as R. G. B. color resists, a black matrix, a spacer, an overcoat, an organic insulating film, and the like (for example, refer to Patent Literature 1). Cured products including the acrylic polymerization-type photosensitive resin material have the characteristics of high light transmittance within a visible light region and excellent color reproducibility, but heat resistance is unsatisfactory and deterioration due to thermal decomposition easily proceeds in a high-temperature environment.

Among various display members, a matrix resin for color resists is required to have particularly high light transmittance and color reproducibility, but usual acrylic polymerization-type photosensitive resin materials do not have satisfactory heat resistance within a baking temperature region of resist formation at 230° C., and do not exhibit satisfactory light transmittance and color reproducibility. Also, with decreasing thickness of displays, the influence of heat generated from light sources such as LED and the like becomes significant, and the market demand for long-term heat resistance reliability is increased.

CITATION LIST

Patent Literature

PTL 1: Japanese Unexamined Patent Application Publication No. 2013-227495

SUMMARY OF INVENTION

Technical Problem

Accordingly, a problem to be solved by the invention is to provide a novolac-type phenolic hydroxyl group-containing resin having excellent heat resistance, transparency, and light transmittance, a production method therefor, a curable composition containing the novolac-type phenolic hydroxyl group-containing resin, a composition for a resist containing the novolac-type phenolic hydroxyl group-containing resin, and a color resist.

Solution to Problem

As a result of repeated earnest research, the inventors found that a novolac-type phenolic hydroxyl group-containing resin having a triarylmethane structure in which two aryl groups among the three aryl groups in the structure have phenolic hydroxyl groups has high heat resistance, transparency, and light transmittance, and is a resin material suitable as a heat resistance imparting agent for a composition for a color resist because of these characteristics, leading to the achievement of the present invention.

That is, the present invention relates to a novolac-type phenolic hydroxyl group-containing resin having as a repeating unit a structural site represented by structural formula (1) below,

[Chem. 1]

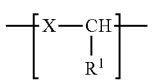

(1)

[in the formula, $R^1$ represents any one of a hydrogen atom, an alkyl group, and an aryl group, and X represents a structural site (α) represented by structural formula (2) below,

[Chem. 2]

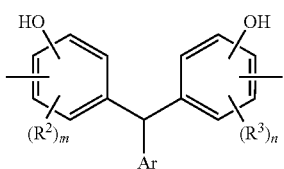

(2)

(in the formula, $R^2$ and $R^3$ each represent any one of a hydrogen atom, an alkyl group, an aryl group, and an aralkyl group; n and m are each an integer of 1 to 3; when n or m is 2 or 3, a plurality of each of $R^2$ and $R^3$ present in a molecule may be the same or different; and Ar represents any one of a phenyl group, a naphthyl group, an anthryl group, and a structural site in which one or a plurality of hydrogen atoms in an aromatic nucleus of any one of these groups is substituted by any one of an alkyl group, an aryl group, and an aralkyl group)].

Further, the present invention relates to a method for producing a novolac-type phenolic hydroxyl group-containing resin, the method including reacting a phenol compound (a) with an aromatic aldehyde compound (b) under the condition of an acid catalyst to produce a triarylmethane compound (X) having two phenolic hydroxyl groups, and then reacting the triarylmethane compound (X) with an aldehyde compound (c) under the condition of an acid catalyst.

Further, the present invention relates to a curable composition containing the novolac-type phenolic hydroxyl group-containing resin and a (meth)acryloyl group-containing compound.

Further, the present invention relates to a composition for a resist containing the novolac-type phenolic hydroxyl group-containing resin and an alkali developing resin.

Further, the present invention relates to a color resist including the composition for a resist.

Advantageous Effects of Invention

According to the present invention, it is possible to provide a novolac-type phenolic hydroxyl group-containing resin having excellent heat resistance, transparency, and light transmittance, a production method therefor, a curable composition containing the novolac-type phenolic hydroxyl group-containing resin, a composition for a resist containing the novolac-type phenolic hydroxyl group-containing resin, and a color resist.

DESCRIPTION OF EMBODIMENTS

Figure 1:
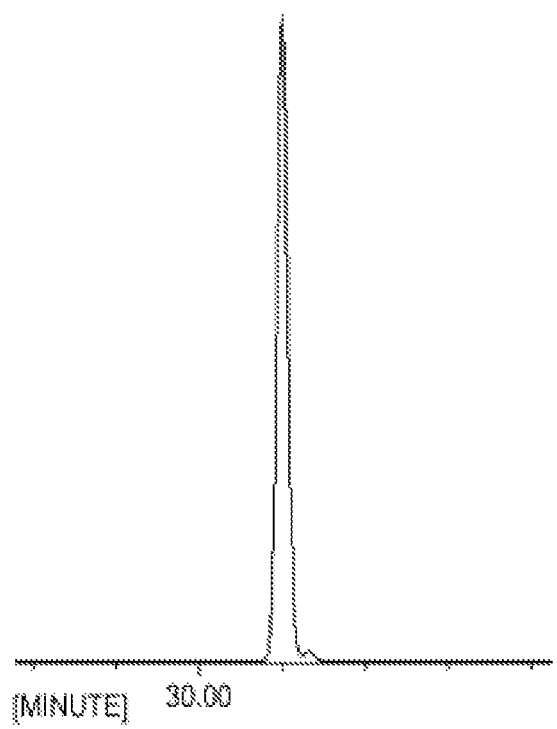
FIG. 1 is a GPC chart of a triarylmethane compound (X) produced in Production Example 1.

A novolac-type phenolic hydroxyl group-containing resin of the present invention has as a repeating unit a structural site represented by structural formula (1) below,

[Chem. 3]

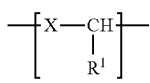
(1)

[in the formula, $R^1$ represents any one of a hydrogen atom, an alkyl group, and an aryl group, and X represents a structural site (α) represented by structural formula (2) below,

[Chem. 4]

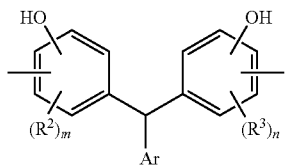
(2)

(in the formula, $R^2$ and $R^3$ each represent any one of a hydrogen atom, an alkyl group, an aryl group, and an aralkyl group; n and m are each an integer of 1 to 3; when n or m is 2 or 3, a plurality of each of $R^2$ and $R^3$ present in a molecule may be the same or different; and Ar represents any one of a phenyl group, a naphthyl group, an anthryl group, or a structural site in which one or a plurality of hydrogen atoms in an aromatic nucleus of any one of these groups is substituted by any one of an alkyl group, an aryl group, and an aralkyl group)].

A triarylmethane structure possessed by the structural site (α) has very high rigidity and contains aromatic rings at a high density, and thus the novolac-type phenolic hydroxyl group-containing resin of the present invention having the structure has very high heat resistance. In the structural formula (2), Ar represents any one of a phenyl group, a naphthyl group, an anthryl group, or a structural site in which one or a plurality of hydrogen atoms in an aromatic nucleus of any one of these groups is substituted by any one of an alkyl group, an aryl group, and an aralkyl group, and thus transparency and light transmittance are excellent while high heat resistance is maintained.

In the structural site (α) represented by the structural formula (2), $R^2$ and $R^3$ are each any one of a hydrogen atom, an alkyl group, an aryl group, and an aralkyl group, and examples thereof include alkyl groups such as a methyl group, an ethyl group, a propyl group, an isopropyl group, a butyl group, a tert-butyl group, a pentyl group, a hexyl group, a cyclohexyl group, a heptyl group, an octyl group, and a nonyl group; aryl groups such as a phenyl group, a tolyl group, a xylyl group, a naphthyl group, an anthryl group, and the like; and aralkyl groups such as a benzyl group, a naphthylmethyl group, an anthrylmethyl group, and the like. Among these, the alkyl groups are preferred because the resin has high heat resistance and excellent transparency and light transmittance. Among these alkyl groups, any one of a methyl group, an ethyl group, a propyl group, an isopropyl group, a butyl group, a tert-butyl group, and a cyclohexyl group is more preferred, and a methyl group is still more preferred.

Also, in the structural formula (2), n and m are each an integer of 1 to 3. In particular, both n and m are preferably 2 because the resin has more excellent heat resistance.

In the structural formula (2), the positions of the two phenolic hydroxyl groups are preferably para-positions to a methine group which joins the three aromatic rings because of excellent photosensitivity and alkali development property in use by addition to a curable composition. In addition, when $R^2$ and $R^3$ are each any one of an alkyl group, an aryl group, and an aralkyl group, and both n and m are 2, the bond position of one of $R^2$ and $R^3$ on an aromatic ring is preferably an ortho-position to a phenolic hydroxyl group, and the other is preferably bonded at a meta-positon.

Therefore, the structural site (α) represented by the structural formula (2) is preferably a structural site (α-1) represented by structural formula (2-1) below,

[Chem. 5]

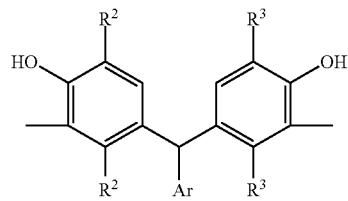
(2-1)

(in the formula, $R^2$ and $R^3$ are each any one of a hydrogen atom, an alkyl group, an aryl group, and an aralkyl group, two each of $R^2$ and $R^3$ may be the same or different, and Ar is any one of a phenyl group, a naphthyl group, an anthryl group, and a structural site in which one or a plurality of hydrogen atoms in an aromatic nucleus of any one of these groups is substituted by any one of an alkyl group, an aryl group, and an aralkyl group).

In the structural formula (2), Ar is any one of a phenyl group, a naphthyl group, an anthryl group, and a structural site in which one or a plurality of hydrogen atoms in an aromatic nucleus of any one of these groups is substituted by any one of an alkyl group, an aryl group, and an aralkyl group, and examples of an alkyl group, an aryl group, and an aralkyl group includes the structures of the examples described above as $R^2$ and $R^3$. Among these, in view of the resin having high heat resistance and excellent transparency and light transmittance, a phenyl group or a structural site in which one or a plurality of hydrogen atoms in a phenyl group is substituted by any one of an alkyl group, an aryl group, and an aralkyl group is preferred. A phenyl group or a structural site in which one or a plurality of hydrogen atoms in a phenyl group is substituted by an alkyl group is more preferred, and a phenyl group is particularly preferred.

In the general formula (1), $R^1$ is any one of a hydrogen atom, an alkyl group, and an aryl group. Among these, a hydrogen atom is more preferred because the novolac-type phenolic hydroxyl group-containing resin of the present invention can be easily produced.

An example of the novolac-type phenolic hydroxyl group-containing resin of the present invention is one produced by, for example, a method for producing a novolac-type phenolic hydroxyl group-containing resin of the present invention, specifically, produced by reacting a phenol compound (a) with an aromatic aldehyde compound (b) under an acid catalyst condition to produce a triarylmethane compound (X) having two phenolic hydroxyl groups, and then reacting the triarylmethane compound (X) with an aldehyde compound (c) under an acid catalyst condition. The production method of the present invention is described in detail below.

The method for producing a novolac-type phenolic hydroxyl group-containing resin of the present invention includes reacting the phenol compound (a) with the aromatic aldehyde compound (b) under the acid catalyst condition to produce the triarylmethane compound (X) having two phenolic hydroxyl groups, and then reacting the triarylmethane compound (X) with the aldehyde compound (c) under the acid catalyst condition. The triarylmethane compound (X) having two phenolic hydroxyl groups is represented by structural formula (3) below,

[Chem. 6]

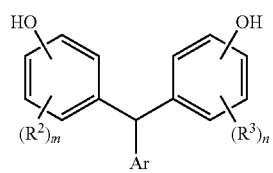

(3)

(in the formula, $R^2$ and $R^3$ each represent any one of a hydrogen atom, an alkyl group, an aryl group, and an aralkyl group; n and m are each an integer of 1 to 3; when n or m is 2 or 3, a plurality of each of $R^2$ and $R^3$ present in a molecule may be the same or different; and Ar represents any one of a phenyl group, a naphthyl group, an anthryl group, and a structural site in which one or a plurality of hydrogen atoms in an aromatic nucleus of any one of these groups is substituted by any one of an alkyl group, an aryl group, and an aralkyl group).

When the novolac-type phenolic hydroxyl group-containing resin of the present invention is produced, the resin may be produced by reacting a combination of the triarylmethane compound (X) and another phenolic hydroxyl group-containing compound (Y) with the aldehyde compound (c). Examples of the other phenolic hydroxyl group-containing compound (Y) include phenol, substituted phenol such as cresol, xylenol, phenylphenol, and the like, naphthol, dihydroxynaphthalene, and the like. These may be used alone or in combination of two or more.

When the novolac-type phenolic hydroxyl group-containing resin of the present invention is produced by using the triarylmethane compound (X) in combination with the other phenolic hydroxyl group-containing compound (Y), the triarylmethane compound (X) is used at a ratio of preferably 50 parts by mass or more and more preferably 80 parts by mass or more in a total of 100 parts by mass of both compounds because the effect of the present invention to achieve excellent heat resistance, transparency, and light transmittance can be sufficiently exhibited.

In the structural formula (3) representing the triarylmethane compound (X), $R^2$, $R^3$, and Ar represent the same meanings as in the structural formula (2), and examples of the triarylmethane compound (X) include compounds represented by structural formulae (1-1) to (1-8) below. In the formulae, Ph represents a phenyl group.

[Chem. 7]

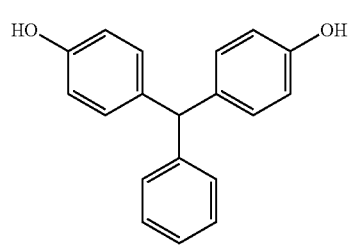

(1-1)

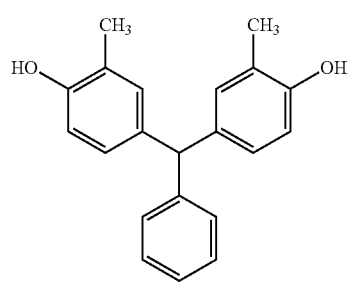

(1-2)

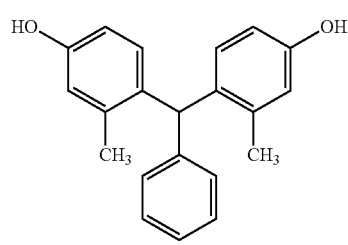

(1-3)

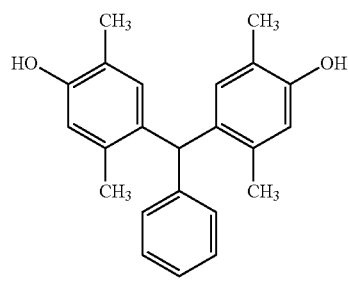

(1-4)

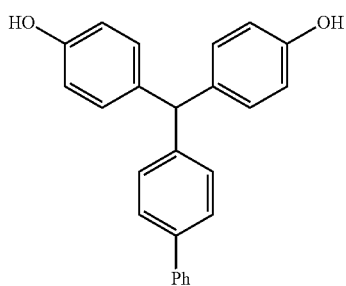

(1-5)

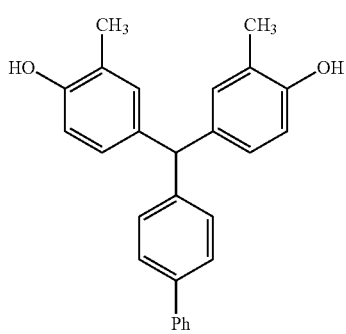

(1-6)

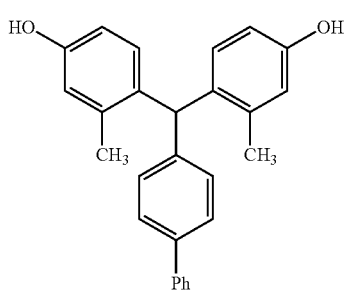

(1-7)

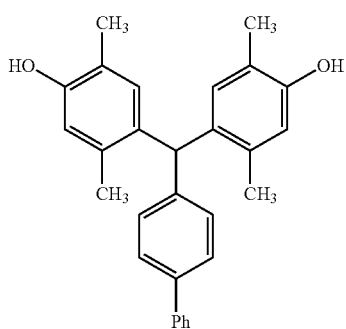

(1-8)

As described above, the triarylmethane compound (X) can be produced by reacting the phenol compound (a) with the aromatic aldehyde compound (b) under the acid catalyst condition. Examples of the phenol compound (a) include phenol, and compounds in which one or a plurality of hydrogen atoms of an aromatic nucleus of phenol is substituted by any of an alkyl group, an aryl group, and an aralkyl group. These may be used alone or in combination of two or more.

In particular, a compound having as a substituent any one of an alkyl group, an aryl group, and an aralkyl group at each of the 2- and 5-positons of phenol is preferred, a compound having as a substituent any one of a methyl group, an ethyl group, a propyl group, an isopropyl group, a butyl group, a tert-butyl group, and a cyclohexyl group at each of the 2- and 5-positons of phenol is more preferred, and 2,5-xylenol is particularly preferred.

Examples of the aromatic aldehyde compound (b) include benzaldehyde, and compounds in which one or a plurality of hydrogen atoms of an aromatic nucleus of benzaldehyde is substituted by any of an alkyl group, an aryl group, and an aralkyl group. These may be used alone or in combination of two or more. In particular, benzaldehyde or a compound in which one or a plurality of hydrogen atoms of an aromatic nucleus of benzaldehyde is substituted by an alkyl group is preferred, and benzaldehyde is particularly preferred.

The reaction molar ratio [(a)/(b)] of the phenol compound (a) to the aromatic aldehyde compound (b) is preferably within a range of 1/0.2 to 1/0.5 and more preferably within a range of 1/0.25 to 1/0.45 because the intended triarylmethane compound (X) can be produced in high yield and high purity.

Examples of the acid catalyst used in reaction of the phenol compound (a) with the aromatic aldehyde compound (b) include acetic acid, oxalic acid, sulfuric acid, hydrochloric acid, phenolsulfonic acid, para-toluenesulfonic acid, zinc acetate, manganese acetate, and the like. These acid catalysts may be used alone or in combination of two or more. Among these, sulfuric acid and para-toluenesulfonic acid are preferred in view of excellent catalytic activity.

If required, the phenol compound (a) may be reacted with the aromatic aldehyde compound (b) in an organic solvent. Examples of the organic solvent used include monoalcohols such as methanol, ethanol, propanol, and the like; polyols such as ethylene glycol, 1,2-propanediol, 1,3-propanediol, 1,4-butanediol, 1,5-pentanediol, 1,6-hexanediol, 1,7-heptanediol, 1,8-octanediol, 1.9-nonanediol, trimethylene glycol, diethylene glycol, polyethylene glycol, glycerin, and the like; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, ethylene glycol monophenyl ether, and the like; cyclic ethers such as 1,3-dioxane, 1,4-dioxane, tetrahydrofuran, and the like; glycol esters such as ethylene glycol acetate and the like; ketones such as acetone, methyl ethyl ketone, methyl isobutyl ketone, and the like. These solvents can be used alone or as a mixed solvent of two or more. Among these, 2-ethoxyethanol is preferred from the viewpoint of excellent solubility of the resultant triarylmethane compound (X).

The reaction of the phenol compound (a) with the aromatic aldehyde compound (b) is performed, for example, within a temperature range of 60° C. to 140° C. for 0.5 to 100 hours.

After the completion of reaction, the unreacted phenol compound (a) and aromatic aldehyde compound (b) and the acid catalyst used are removed from the reaction product by a method including pouring the reaction product into a poor solvent (S1) for the triarylmethane compound (X), and filtering off the produced precipitate and then re-dissolving the precipitate in a solvent (S2) having a high property of resolving the triarylmethane compound (X) and miscibility with the poor solvent (S1), and thus the purified triarylmethane compound (X) can be produced.

When the phenol compound (a) is reacted with the aromatic aldehyde compound (b) in an aromatic hydrocarbon solvent such as toluene, xylene, or the like, a crystal of the triarylmethane compound (X) can be precipitated by heating the reaction product to 80° C. or more to dissolve the triarylmethane compound (X) in the aromatic hydrocarbon solvent and cooling the resultant solution as it is.

Examples of the poor solvent (S1) used for purifying the triarylmethane compound (X) include water; monoalcohols such as methanol, ethanol, propanol, ethoxyethanol, and the like; aliphatic hydrocarbons such as n-hexane, n-pentane, n-octane, cyclohexane, and the like; and aromatic hydrocarbons such as toluene, xylene, and the like. These can be used alone or in combination of two or more. Among these, water, methanol, and ethoxyethanol are preferred because of the excellent solubility of the acid catalyst.

On the other hand, examples of the solvent (S2) include monoalcohols such as methanol, ethanol, propanol, and the like; polyols such as ethylene glycol, 1,2-propanediol, 1,3-propanediol, 1,4-butanediol, 1,5-pentanediol, 1,6-hexanediol, 1,7-heptanediol, 1,8-octanediol, 1.9-nonanediol, trimethylene glycol, diethylene glycol, polyethylene glycol, glycerin, and the like; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, ethylene glycol monophenyl ether, and the like; cyclic ethers such as 1,3-dioxane, 1,4-dioxane, and the like; glycol esters such as ethylene glycol acetate and the like; ketones such as acetone, methyl ethyl ketone, methyl isobutyl ketone, and the like. These can be used alone or in combination of two or more. Among these, when water or monoalcohol is used as the poor solvent (S1), acetone is preferably used as the solvent (S2).

Next, the triarylmethane compound (X) is r eacted with the aldehyde compound (c) under the acid catalyst condition. As described above, when the novolac phenolic phenol resin of the present invention is produced, another phenolic hydroxyl group-containing compound (Y) may be used in combination with the triarylmethane compound (X).

Examples of the aldehyde compound (c) used include formaldehyde, para-formaldehyde, 1,3,5-trioxane, acetaldehyde, propionaldehyde, tetraoxymethylene, polyoxymethylene, chloral, hexamethylenetetramine, furfural, glyoxal, n-butylaldehyde, caproaldehyde, allylaldehyde, crotonaldehyde, acrolein, and the like. These can be used alone or in combination of two or more. Among these, formaldehyde is preferably used because of excellent reactivity. Formaldehyde may be used either as formalin in an aqueous solution state or as paraformaldehyde in a solid state. When formaldehyde is used in combination with another aldehyde compound, the other aldehyde compound is preferably used at a molar ratio of 0.05 to 1 mole to 1 mole of formaldehyde.

The reaction molar ratio [(X)/(c)] of the triarylmethane compound (X) to the aldehyde compound (c) is preferably within a range of 1/0.5 to 1/1.2 and more preferably within a range of 1/0.6 to 1/0.9 because excessive increase in molecular weight (gelation) can be suppressed, and the novolac-type phenolic hydroxyl group-containing resin having an appropriate molecular weight can be produced as a composition for a resist.

When the other phenolic hydroxyl group-containing compound (Y) is used in combination with the triarylmethane compound (X), the reaction molar ratio [(X+Y)/(c)] of the total of both compounds to the aldehyde compound (c) is preferably within a range of 1/0.5 to 1/1.2 and more preferably within a range of 1/0.6 to 1/0.9.

Examples of the acid catalyst used in reaction of the triarylmethane compound (X) with the aldehyde compound (c) include acetic acid, oxalic acid, sulfuric acid, hydrochloric acid, phenolsulfonic acid, para-toluenesulfonic acid, zinc acetate, manganese acetate, and the like. These acid catalysts may be used alone or in combination of two or more. Among these, sulfuric acid and para-toluenesulfonic acid are preferred in view of excellent catalytic activity.

If required, the triarylmethane compound (X) may be reacted with the aldehyde compound (c) in an organic solvent. Examples of the solvent used include monoalcohols such as methanol, ethanol, propanol, and the like; polyols such as ethylene glycol, 1,2-propanediol, 1,3-propanediol, 1,4-butanediol, 1,5-pentanediol, 1,6-hexanediol, 1,7-heptanediol, 1,8-octanediol, 1.9-nonanediol, trimethylene glycol, diethylene glycol, polyethylene glycol, glycerin, and the like; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, ethylene glycol monophenyl ether, and the like; cyclic ethers such as 1,3-dioxane, 1,4-dioxane, tetrahydrofuran, and the like; glycol esters such as ethylene glycol acetate and the like; ketones such as acetone, methyl ethyl ketone, methyl isobutyl ketone, and the like. These solvents can be used alone or as a mixed solvent of two or more. Among these, 2-ethoxyethanol is preferred because of excellent solubility of the resultant aromatic compound (A).

The reaction of the triarylmethane compound (X) with the aldehyde compound (c) is performed, for example, within a temperature range of 60° C. to 140° C. for 0.5 to 100 hours.

After the completion of reaction, the novolac-type phenolic hydroxyl group-containing resin of the present invention can be produced by performing a reprecipitation operation of by adding water to the reaction product. The weight-average molecular weight (Mw) of the resultant novolac-type phenolic hydroxyl group-containing resin is preferably within a range of 2,000 to 35,000 and more preferably within a range of 5,000 to 10,000 because the resin has excellent heat resistance and when used by being added to a composition for a color resist, the composition has excellent photosensitivity and alkali development property.

Also, the polydispersity (Mw/Mn) of the novolac-type phenolic hydroxyl group-containing resin is preferably within a range of 1.3 to 2.5 because the resin has excellent heat resistance and when used by being added to a composition for a color resist, the composition has excellent photosensitivity and alkali development property.

In the present invention, the weight-average molecular weight (Mw) and the polydispersity (Mw/Mn) are values measured by GPC under conditions below.

[Conditions for GPC Measurement]

Measuring apparatus: "HLC-8220 GPC" manufactured by Tosoh Corporation

Column: "Shodex KF802" (8.0 mm ϕ×300 mm) manufactured by Showa Denko K.K.+"Shodex KF802" (8.0 mm ϕ×300 mm) manufactured by Showa Denko K.K.+"Shodex KF803" (8.0 mm ϕ×300 mm) manufactured by Showa Denko K.K.+"Shodex KF804" (8.0 mm ϕ×300 mm) manufactured by Showa Denko K.K.

Column temperature: 40° C.

Detector: RI (differential refractometer)

Data processing: "GPC-8020 model II version 4.30" manufactured by Tosoh Corporation Developing solvent: tetrahydrofuran Flow rate: 1.0 ml/min Sample: prepared by filtering a 0.5 mass % tetrahydrofuran solution in terms of resin solid content with a microfilter.

Injection amount: 0.1 ml

Standard sample: monodisperse polystyrene described below.

(Standard Sample: Monodisperse Polystyrene)
"A-500" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation The novolac-type phenolic hydroxyl group-containing resin of the present invention has excellent heat resistance, transparency, and light transmittance and thus can be added as a heat resistance imparting agent to various resin materials. For example, when a curable composition containing a (meth)acryloyl group-containing compound is combined with the novolac-type phenolic hydroxyl group-containing resin of the present invention, the curable composition excellent in both light transmittance and heat resistance can be produced. Also, when an alkali developing resin is combined with the novolac-type phenolic hydroxyl group-containing resin of the present invention, a composition for a resist excellent in both light transmittance and heat resistance can be produced. When the alkali developing resin is an acrylic polymerization-type photosensitive resin, the composition can be preferably used particularly as a color resist material.

When the novolac-type phenolic hydroxyl group-containing resin of the present invention is used in a composition for a resist, various alkali developing resins which are generally used as resist materials can be used.

Examples of the alkali developing resin include an acid group-containing acrylate resin (v1) produced by reacting an epoxy group-containing compound, (meth)acrylic acid, and an acid anhydride, an acid group-containing acrylic polymer (v2), an acid group-containing acrylate resin (v3) produced by reacting an acid group-containing acrylic polymer with an epoxy group-containing (meth)acrylate compound, and the like. These may be used alone or in combination of two or more.

Specifically, the acid group-containing acrylate compound (v1) is a compound produced by further reacting an acid anhydride with an epoxy acrylate produced by reacting an epoxy compound with (meth)acrylic acid. Examples of the epoxy group-containing compound include various epoxy resins and epoxy group-containing acrylic polymers. Examples of the epoxy resins include bisphenol epoxy resins, biphenol epoxy resins, diglycidyl phthalate resins, triglycidyl isocyanurate compounds, phenol novolac epoxy resins, cresol novolac epoxy resins, bisphenol novolac epoxy resins, alicyclic epoxy resins, dicyclopentadiene phenolic epoxy resins, and the like.

Examples of the epoxy group-containing acrylic polymers include copolymers of glycidyl (meth)acrylate with other ethylenically unsaturated group-containing monomers. Examples of the other ethylenically unsaturated group-containing monomers include (meth)acrylic acid esters such as methyl (meth)acrylate, n-butyl (meth)acrylate, 2-ethylhexyl (meth)acrylate, 2-hydroxyethyl (meth)acrylate, allyl (meth)acrylate, benzyl (meth)acrylate, cyclohexyl (meth)acrylate, isobornyl (meth)acrylate, and the like; styrene; and the like. These may be used alone or in combination of two or more.

Examples of the acid anhydride include anhydrides of acids such as acrylic acid, maleic acid, succinic acid, itaconic acid, phthalic acid, tetrahydrophthalic acid, hexahydrophthalic acid, methylhexahydrophthalic acid, methyl (end)-methylene tetrahydrophthalic acid, chlorendic acid, methyltetrahydrophthalic acid, glutaric acid, trimellitic acid, and the like. These may be used alone or in combination of two or more.

The molecular weight, (meth)acryloyl group equivalent, and acid value of the acid group-containing acrylate compound (v1) are property adjusted according to application and desired performance. However, because of excellent curability and development properties, the weight-average molecular weight (Mw) is preferably within a range of 3,000 to 100,000, and the acid value is preferably within a range of 50 to 200 mgKOH.

Examples of the acid group-containing acrylic polymer (v2) include copolymers of an ethylenically unsaturated group-containing monomer having an acid group with other ethylenically unsaturated group-containing monomers. Examples of the ethylenically unsaturated group-containing monomer having an acid group include (meth)acrylic acid, maleic acid, maleic anhydride, mono[2-(meth) acryloyloxyethyl] succinate, ω-carboxypolycaprolactone mono(meth)acrylate, p-vinylbenzoic acid, and the like. These may be used alone or in combination of two or more. Examples of the other ethylenically unsaturated group-containing monomers include (meth)acrylic acid esters such as methyl (meth)acrylate, n-butyl (meth)acrylate, 2-ethylhexyl (meth)acrylate, 2-hydroxyethyl (meth)acrylate, allyl (meth)acrylate, benzyl (meth)acrylate, cyclohexyl (meth)acrylate, isobornyl (meth)acrylate, and the like; styrene; and the like. These may be used alone or in combination of two or more.

The molecular weight and acid value of the acid group-containing acrylic polymer (v2) are property adjusted according to application and desired performance. However, because of excellent curability and development properties, the weight-average molecular weight (Mw) is preferably within a range of 1,000 to 100,000, and the acid value is preferably within a range of 50 to 200 mgKOH.

Examples of the acid group-containing acrylate resin (v3) include a resin produced by further reacting the acid group-containing acrylic polymer (v2) with an epoxy group-containing methacrylate compound such as glycidyl (meth)acrylate, mono(meth)acrylate of a bisphenol epoxy compound, or the like.

The molecular weight, acid value, and acryloyl group equivalent of the acid group-containing acrylate resin (v3) are property adjusted according to application and desired performance. However, because of excellent curability and development properties, the weight-average molecular weight (Mw) is preferably within a range of 3,000 to 100,000, and the acid value is preferably within a range of 50 to 200 mgKOH.

The composition for a resist of the present invention may contain another resin component in addition to the alkali developing resin. Examples of the other resin component include polyfunctional (meth)acrylate compounds such as alkylene glycol di(meth)acrylate, polyoxyalkylene glycol (meth)acrylate, hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, trimethylolethane tri(meth)acrylate, trimethylolpropane di(meth)acrylate, trimethylolpropane tri(meth)acrylate, glycerin di(meth)acrylate, glycerin tri(meth)acrylate, dicyclopentene di(meth)acrylate, cyclohexanediol (meth)acrylate, tri(meth)acryloyloxy isocyanurate, bisphenol di(meth)acrylate, and the like. These may be used alone or in combination of two or more.

When the composition for a resist of the present invention contains a photopolymerization initiator, it can be cured by irradiation with active energy rays such as ultraviolet light or the like. Examples of the photopolymerization initiator used include benzophenone compounds, thioxanthone compounds, acetophenone compounds, biimidazole compounds, triazine compounds, O-acyloxime compounds, azo compounds, organic peroxides, and the like. These may be used alone or in combination of two or more. The amount of the photopolymerization initiator added is preferably within a range of 0.01 to 10 parts by mass in 100 parts by mass of the composition for a resist.

If required, the composition for a resist of the present invention may contain a proper organic solvent. Examples of the organic solvent used include alkylene glycol monoalkyl ethers, alkylene glycol dialkyl ethers, polyoxyalkylene glycol monoalkyl ethers, poloxyalkylene glycol dialkyl ethers, alkylene glycol alkyl ether acetates, cyclic ether compounds, ester compounds, and the like. These may be used alone or in combination of two or more.

If required, the composition for a resist of the present invention may contain other additives. Examples of the other additives include a sensitizer, a polymerization terminator, a chain transfer agent, a leveling agent, a plasticizer, a surfactant, a defoaming agent, a silane coupling agent, and the like.

By the same method as for usual resist materials, the composition for a resist of the present invention can be used for various display member applications such as a color resist, a black matrix, a spacer, an overcoat, and the like. In order to form a resist pattern by using the composition for a resist of the present invention, for example, first the composition for a resist of the present invention is applied to a surface of a substrate by a spray method, a roll coater method, a rotary coating method, or the like, and the solvent is removed by heating at a temperature of 70° C. to 110° C. for about 1 to 15 minutes to form a coating film. Next, a desired pattern is formed by irradiating the coating film with active energy rays such as ultraviolet light, electron beams, X-rays, or the like, and then developed with an alkali developer. After development, the pattern is washed with ultrapure water, if required again irradiated with active energy rays, and then heat-treated at a temperature of 150° C. to 250° C. for 30 to 90 minutes.

The composition for a resist of the present invention has the characteristic of excellent transparency and thus can be preferably used, particularly, for color resist application.

EXAMPLES

The present invention is described in further detail below by giving examples. Conditions for GPC measurement are as follows.

[Conditions for GPC Measurement]
Measuring apparatus: "HLC-8220 GPC" manufactured by Tosoh Corporation
Column: "Shodex KF802" (8.0 mm ϕ×300 mm) manufactured by Showa Denko K.K.+"Shodex KF802" (8.0 mm ϕ×300 mm) manufactured by Showa Denko K.K.+"Shodex KF803" (8.0 mm ϕ×300 mm) manufactured by Showa Denko K.K.+"Shodex KF804" (8.0 mm ϕ×300 mm) manufactured by Showa Denko K.K.
Column temperature: 40° C.
Detector: RI (differential refractometer)
Data processing: "GPC-8020 model II version 4.30" manufactured by Tosoh Corporation
Developing solvent: tetrahydrofuran
Flow rate: 1.0 ml/min
Sample: prepared by filtering a 0.5 mass % tetrahydrofuran solution in terms of resin solid content with a microfilter.
Injection amount: 0.1 ml
Standard sample: monodisperse polystyrene described below.

(Standard Sample: Monodisperse Polystyrene)
"A-500" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation $^{13}$C-NMR spectrum measurement was performed by using "AL-400" manufactured by JEOL Ltd., and structural analysis was performed by analyzing a DMSO-$d_6$ solution of a sample. Conditions for measurement of a $^{13}$C-NMR spectrum are given blow.

[Conditions for Measurement of $^{13}$C-NMR Spectrum]
Measurement mode: SGNNE (NOE-suppressed 1H complete decoupling method)
Pulse angle: 45° pulse
Sample concentration: 30 wt %
Number of acquisitions: 10,000

Production Example 1

Synthesis of Triarylmethane Compound (X)

Figure 2:
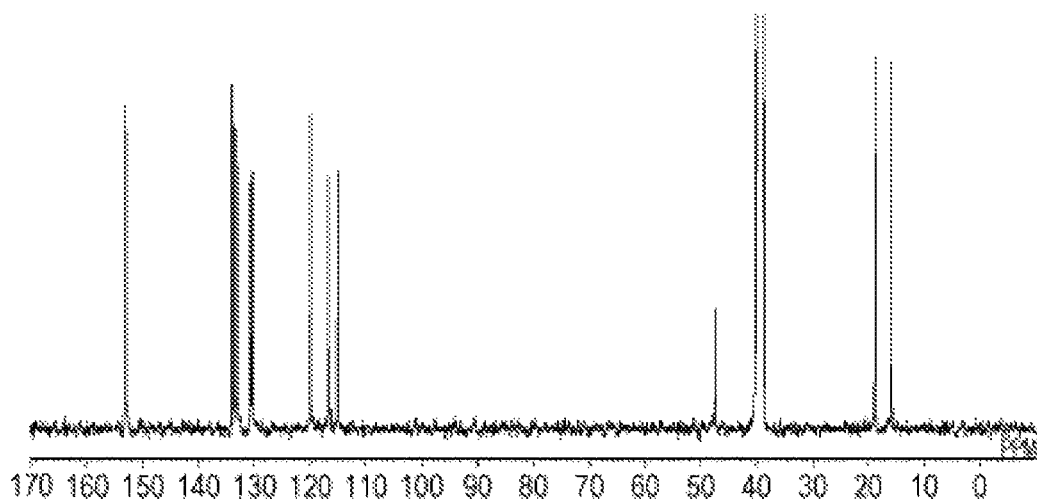
FIG. 2 is a $^{13}C$—NMR chart of a triarylmethane compound (X) produced in Production Example 1.

In a 2L four-necked flask provided with a stirrer and a thermometer, 293.3 g (2.4 moles) of 2,5-xylenol and 106.1 g (1 mole) of benzaldehyde were charged and dissolved in 500 ml of 2-ethoxyethanol. Then, 10 ml of sulfuric acid was added to the resultant solution under cooling in an ice bath, and the mixture was reacted by heating and stirring for 2 hours at 100° C. with a mantle heater. After the reaction, a crude product was produced by performing reprecipitation from the resultant solution with water. The crude product was re-dissolved in acetone, and a reprecipitation operation was further performed with water. Then, the resultant product was filtered off and dried under vacuum to produce 206 g of a white crystal of the triarylmethane compound (X). FIG. 1 shows a GPC chart of the triarylmethane compound (X) and FIG. 2 shows a $^{13}$C-NMR chart. It was confirmed by $^{13}$C-NMR analysis that the resultant triarylmethane compound (X) has a molecular structure represented by structural formula (x) below. Also, the content of the compound represented by the structural formula (x) calculated from the GPC chart was 98.7%.

[Chem. 9]

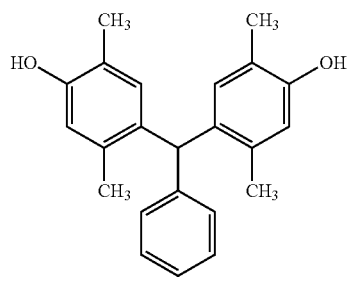

(x)

Example 1

Synthesis of Novolac-Type Phenolic Hydroxyl Group-Containing Resin (1)

Figure 3:
FIG. 3 is a GPC chart of a novolac-type phenolic hydroxyl group-containing resin (1) produced in Example 1.

In a 300-ml four-necked flask provided with a condenser, 16.6 g (0.05 moles) of the triarylmethane compound (X) produced in Production Example 1 and 1.6 g (0.05 moles) of 92 mass % paraformaldehyde were charged and dissolved in 15 ml of 2-ethoxyethanol and 15 ml of acetic acid. Then, 10 ml of sulfuric acid was added to the resultant solution under cooling in an ice bath, and the mixture was heated to 80° C. in an oil bath and reacted by continuously heating and stirring for 4 hours. After the reaction, a crude product is produced by reprecipitation from the resultant solution with water. The crude product was re-dissolved in acetone, and reprecipitation was further performed with water. Then, the resultant product was filtered off and dried under vacuum to produce 16.5 g of a white powder of novolac-type phenolic hydroxyl group-containing resin (1). FIG. 3 shows a GPC chart of the novolac-type phenolic hydroxyl group-containing resin (1). The novolac-type phenolic hydroxyl group-containing resin (1) had a number-average molecular weight (Mn) of 3,708, a weight-average molecular weight (Mw) of 7,730, and a polydispersity (Mw/Mn) of 2.085.

Comparative Production Example 1

Synthesis of Novolac-Type Phenolic Hydroxyl Group-Containing Resin (1') for Comparison In a 2L four-necked flask provided with a stirrer and a thermometer, 648 g (6 moles) of m-cresol, 432 g (4 moles) of p-cresol, 2.5 g (0.2 moles) of oxalic acid, and 492 g of 42 mass % formaldehyde were charged and heated to 100° C. and reacted. Dehydration and distillation were performed up to 200° C. under normal pressure, and reduced-pressure distillation was performed at 230° C. for 6 hours to produce 736 g of a light yellow solid of novolac-type phenolic hydroxyl group-containing resin (1') for comparison. The novolac-type phenolic hydroxyl group-containing resin (1') for comparison had a number-average molecular weight (Mn) of 1,450, a weight-average molecular weight (Mw) of 10,316, and a polydispersity (Mw/Mn) of 7.116.

Production Example 1

Production of Alkali Developing Resin (1)

In a flask provided with a condenser and a stirrer, 100 g of propylene glycol monomethyl ether acetate was charged, followed by nitrogen purging. After heating to 80° C., a mixed solution of 100 g of propylene glycol monomethyl ether acetate, 20 g of methacrylic acid, 10 g styrene, 5 g of benzyl methacrylate, 15 g of 2-hydroxyethyl methacrylate, 23 g of 2-ethylhexyl methacrylate, 12 g of N-phenylmaleimide, 15 g of mono(2-acryloyloxyethyl) succinate, and 6 g of 2,2'-azobis(2,4-dimethylvaleronitrile) was added dropwise at the same temperature over 1 hour, and polymerized for 2 hours while the temperature was maintained. Then, the temperature of the reaction solution was increased to 100° C., and polymerization is further performed for 1 hour to produce an alkali developing resin (1) solution with a nonvolatile content of 33% by mass. The resultant alkali developing resin (1) had a weight-average molecular weight (Mw) of 13,000 and a number-average molecular weight (Mn) of 6,000.

Example 2 and Comparative Example 1

The novolac-type phenolic hydroxyl group-containing resin (1) and the novolac-type phenolic hydroxyl group-containing resin (1') for comparison were evaluated with respect to various items by methods described below. The results are shown in Table 1.

<Evaluation of Heat Resistance>

Each of a propylene glycol monomethyl ether acetate solution with a solid content of 40% by mass of the novolac-type phenolic hydroxyl group-containing resin (1) and a propylene glycol monomethyl ether acetate solution with a solid content of 40% by mass of the novolac-type phenolic hydroxyl group-containing resin (1') for comparison was prepared. Each of the solutions was applied on a silicon wafer of 5 inches by using a spin coater so that the thickness was about 1 μm, and then dried for 60 seconds on a hot plate of 110° C. The resin was scraped off from the resultant wafer and the glass transition temperature (hereinafter abbreviated as "Tg") was measured. Tg was measured by using a differential scanning calorimeter ("differential scanning calorimeter" (DSC) Q100" manufactured by T.A. Instruments, Inc.) in a nitrogen atmosphere under the conditions of a temperature range of—100° C. to 200° C. and a heating rate of 10 ° C./min.

<Evaluation of Transparency and Tone>

Each of a propylene glycol monomethyl ether acetate solution with a solid content of 40% by mass of the novolac-type phenolic hydroxyl group-containing resin (1) and a propylene glycol monomethyl ether acetate solution with a solid content of 40% by mass of the novolac-type phenolic hydroxyl group-containing resin (1') for comparison was prepared. Each of the solutions was applied to a thickness of 100 μm on a PET film of 100 μm in thickness and then dried for 2 minutes in a constant-temperature dryer of 100° C. to form a test film. The test film was heated for 24 hours in a high-temperature dryer of 121° C., and a color tone of the test film was evaluated by visual observation before and after heat treatment.

<Evaluation of Light Transmittance>

Each of a propylene glycol monomethyl ether acetate solution with a solid content of 40% by mass of the novolac-type phenolic hydroxyl group-containing resin (1) and a propylene glycol monomethyl ether acetate solution with a solid content of 40% by mass of the novolac-type phenolic hydroxyl group-containing resin (1') for comparison was prepared. The absorbance of each of the solutions was measured with light at each of the wavelengths of 365 nm, 405 nm, and 436 nm. The measurement was performed under the following conditions.

Apparatus: "Ultraviolet-visible spectrophotometer" ("UV-1600" manufactured by Shimadzu Corporation)
  Measurement cell: quartz cell
  Optical path length: 10 mm
  Optical path width: 10 mm
  Spectral band width: 2 nm
  Measurement wavelength range: 190 to 750 nm
  Wavelength scale: 25 nm/cm
  Scan speed: 100 nm/min

TABLE 1

| | | Example 2 | Comparative Example 1 |
|---|---|---|---|
| Novolac-type phenolic hydroxyl group-containing resin | | (1) | (1') |
| Heat resistance (Tg) [° C.] | | >200 | 110 |
| Color tone | Before heat treatment | Colorless and transparent | Colorless and transparent |
| | After heat treatment | Colorless and transparent | Translucent brown |
| Absorbance | 365 nm | 0.112 | 0.156 |
| | 405 nm | 0.033 | 0.058 |
| | 436 nm | 0.012 | 0.033 |

Example 3 and Comparative Example 2

A composition for a resist was prepared with each of the compositions shown in Table 2 and evaluated with respect to various items under conditions described below. The results are shown in Table 2.

Details of components shown in Table 2 are as follows.

(Meth)acryloyl group-containing compound: a mixture of dipentaerythritol hexaacrylate and dipentaerythritol pentaacrylate ("Aronix M-402" manufactured by Toagosei Co., Ltd.)

Photopolymerization initiator: "Irgacure 369" manufactured by Ciba Specialty Chemicals Inc.

PGMEA: Propylene glycol monomethyl ether acetate

<Evaluation of Transparency and Tone>

A composition for a resist prepared with each of the compositions shown in Table 2 was applied by a spin coater on a 5-inch soda glass substrate having a $SiO_2$ film formed on a surface thereof. The resultant coating was dried for 120 seconds on a hot plate of 90° C. and then irradiated with ultraviolet light of 400 mJ/cm$^2$ by using a high-pressure mercury lamp containing each of the wavelengths of 365 nm, 405 nm, and 436 nm to produce a coating film (test sample) having a thickness of 2.0 µm. The test sample was heated for 24 hours in a high-temperature dryer of 121° C., and a color tone of the test coating film was evaluated by visual observation before and after heat treatment.

<Evaluation of Alkali Development Property>

A composition for a resist prepared with each of the compositions shown in Table 2 was applied by a spin coater on a silicon wafer having a diameter 5 inches. Then, the resultant coating was dried for 60 seconds at 110° C. to form a coating film having a thickness of about 2.5 µm. The coating film was cooled to room temperature and then a photomask was placed on the coating film which was then exposed to light by irradiation with ultraviolet light of 400 mJ/cm$^2$ by using a high-pressure mercury lamp. After exposure to light, the silicon wafer was immersed in an alkali solution (0.04% by mass aqueous potassium hydroxide solution) for 60 seconds. A pattern surface was washed with ultrapure water, spin-dried by a spin coater, and then heated at 200° C. for 30 minutes. The state of the resultant resist pattern on the silicon wafer was confirmed by a laser microscope ("VK-8500" manufactured by Keyence Corporation) and evaluated according to criteria described below.
  A: Resolution was possible with L/S=30 µm.
  B: Resolution was impossible with L/S=30 µm.

TABLE 2

| | | Example 3 | Comparative Example 2 |
|---|---|---|---|
| Novolac-type phenolic hydroxyl group-containing resin (1) | | 2.5 | 2.5 |
| Alkali developing resin (1) | | 6 | 6 |
| (Meth)acryloyl group-containing compound | | 2 | 2 |
| Photopolymerization initiator | | 1 | 1 |
| PGMEA | | 18.5 | 18.5 |
| Color tone | Before heat treatment | Colorless and transparent | Colorless and transparent |
| | After heat treatment | Colorless and transparent | Translucent brown |
| Alkali development property | | A | A |

The invention claimed is:

1. A curable composition comprising a novolac phenolic hydroxyl group-containing resin and a (meth)acryloyl group-containing compound
  wherein the novolac phenolic hydroxyl group-containing resin having as a repeating unit a structural site represented by structural formula (1) below,

[Chem. 1]

$$\left[\begin{array}{c} X-CH \\ | \\ R^1 \end{array}\right] \quad (1)$$

[in the formula, $R^1$ represents any one of a hydrogen atom, an alkyl group, and an aryl group, and X represents a structural site (α) represented by structural formula (2) below,

[Chem. 2]

(2)

(in the formula, $R^2$ and $R^3$ each represent any one of a hydrogen atom, an alkyl group, an aryl group, and an aralkyl group; n and m are each an integer of 1 to 3; when n or m is 2 or 3, a plurality of each of $R^2$ and $R^3$ present in a molecule may be the same or different; and Ar represents any one of a phenyl group, a naphthyl group, an anthryl group, or a structural site in which one or a plurality of hydrogen atoms in an aromatic nucleus of any one of these groups is substituted by any one of an alkyl group, an aryl group, and an aralkyl group)].

2. The curable composition according to claim 1, wherein the structural site (α) is a structural site (α-1) represented by structural formula (2-1) below

[Chem. 3]

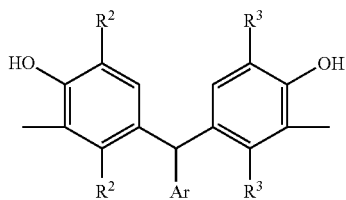

(2-1)

(in the formula, $R^2$ and $R^3$ are each any one of a hydrogen atom, an alkyl group, an aryl group, and an aralkyl group, two each of $R^2$ and $R^3$ may be the same or different, and Ar is any one of a phenyl group, a naphthyl group, an anthryl group, or a structural site in which one or a plurality of hydrogen atoms in an aromatic nucleus of any one of these groups is substituted by any one of an alkyl group, an aryl group, and an aralkyl group).

3. The curable composition according to claim 2, wherein both $R^2$ and $R^3$ are a methyl group, and Ar is a phenyl group.

4. A color resist comprising the curable composition according to claim 2.

5. A color resist comprising the curable composition according to claim 3.

6. The curable composition according to claim 1, wherein $R^1$ is a hydrogen atom.

7. A color resist comprising the curable composition according to claim 6.

8. The curable composition according to claim 1 further comprising an alkali developing resin.

9. A color resist comprising the curable composition according to claim 8.

10. A color resist comprising the curable composition according to claim 1.

* * * * *